(12) United States Patent
Maeda et al.

(10) Patent No.: US 8,211,612 B2
(45) Date of Patent: Jul. 3, 2012

(54) FLUORINE-CONTAINING POLYMER COATING COMPOSITION, METHOD FOR FORMING FLUORINE-CONTAINING POLYMER FILM USING COATING COMPOSITION, AND METHOD FOR FORMING PHOTORESIST OR LITHOGRAPHIC PATTERN

(75) Inventors: Kazuhiko Maeda, Tokyo (JP);
Mitsutaka Otani, Kawagoe (JP);
Haruhiko Komoriya, Kawagoe (JP);
Takeo Komata, Kawagoe (JP); Shinya Akiba, Kawagoe (JP)

(73) Assignee: Central Glass Company, Limited, Yamaguchi (JP)

( * ) Notice: Subject to any disclaimer, the term of this patent is extended or adjusted under 35 U.S.C. 154(b) by 704 days.

(21) Appl. No.: 11/591,548

(22) Filed: Nov. 2, 2006

(65) Prior Publication Data
US 2007/0105044 A1 May 10, 2007

(30) Foreign Application Priority Data
Nov. 4, 2005 (JP) .................................. 2005-321599

(51) Int. Cl.
*G03C 1/00* (2006.01)
*G03C 7/00* (2006.01)
*G03F 1/00* (2006.01)
*G03F 7/00* (2006.01)
*C07D 307/00* (2006.01)
*C07D 317/00* (2006.01)
*C07D 323/02* (2006.01)

(52) U.S. Cl. .................. 430/270.1; 430/273.1; 549/429; 549/430; 549/449

(58) Field of Classification Search .................. 524/265; 430/270.1, 273.1; 526/206; 568/591, 674; 549/429, 430, 449
See application file for complete search history.

(56) References Cited

U.S. PATENT DOCUMENTS

| 2,925,424 | A | | 2/1960 | Simmons, Jr. | |
| 7,288,362 | B2 | * | 10/2007 | Allen et al. | 430/270.1 |
| 2003/0166807 | A1 | * | 9/2003 | Harrison et al. | 526/206 |
| 2005/0233254 | A1 | * | 10/2005 | Hatakeyama et al. | 430/311 |
| 2005/0250898 | A1 | | 11/2005 | Maeda et al. | |
| 2007/0026341 | A1 | * | 2/2007 | Hatakeyama et al. | 430/270.1 |

FOREIGN PATENT DOCUMENTS

| EP | 83935 A1 * | 1/1983 |
| EP | 1589082 | 10/2005 |
| GB | 748413 | 5/1956 |
| JP | 58049376 A * | 3/1983 |
| JP | 4-120041 | 4/1992 |
| JP | 2001-048821 | 2/2001 |
| JP | 2001-064465 | 3/2001 |
| JP | 2003-040840 | 2/2003 |
| JP | 2003-252819 | 9/2003 |
| JP | 2004-035845 | 2/2004 |
| JP | 2005-306902 | 11/2005 |
| WO | 2004/067655 | 8/2004 |
| WO | 2005/098541 | 10/2005 |

OTHER PUBLICATIONS

Sharif et al., "Advances in TFE Based Fluoropolymers for 157nm Lithography: A Progree Report," Proceedings of SPIE vol. 5039 (2003), pp. 33-42.*
Journal of Photopolymer Science and Technology, vol. 18, No. 5, 2005 pp. 571-577 "Opportunities and Challenges in Immersion Lithography" Maenhoudt, M. et al.
Journal of Photopolymer Science and Technology, vol. 18, No. 5, 2005 pp. 593-602.
Leaching Phenomena and their Suppresion in 193 nm Immersion Lithography, Dammel, Ralph et al.
Proceddings of SPIE, vol. 5753 Part One of Two Parts, pp. 20-30 "Impact of Water and Top-coats on Lithographic Performance in 193-nm Immersion Lithography" Kishimura, S. et al.
Notice of Reasons for Refusal issued on Sep. 6, 2011 by the Japanese Patent Office in corresponding Japanese Patent Application No. 2005-321599 w/English Translation, 7 pages.

* cited by examiner

*Primary Examiner* — Cynthia Kelly
*Assistant Examiner* — Connie P Johnson
(74) *Attorney, Agent, or Firm* — Young & Thompson

(57) ABSTRACT

A method for forming a protective film of a fluorine-containing polymer composition excellent in smoothness and adhesiveness on a photoresist. Moreover, there is provided a means for removing the protective film without impairing the underlying photoresist. A polymer coating composition obtainable by dissolving a fluorine-containing polymer compound in a solvent comprising a fluorinated acetal having a specific structure is applied on a photoresist and dried to form a protective film. A fluorinated acetal having the specific structure is suitable as a solvent for being brought into contact with a fluorine-containing polymer film, peeling the film, and forming a photoresist or a lithographic pattern.

12 Claims, No Drawings

FLUORINE-CONTAINING POLYMER COATING COMPOSITION, METHOD FOR FORMING FLUORINE-CONTAINING POLYMER FILM USING COATING COMPOSITION, AND METHOD FOR FORMING PHOTORESIST OR LITHOGRAPHIC PATTERN

FIELD OF THE INVENTION

The present invention relates to a fluorine-containing polymer coating composition obtainable by dissolving a fluorine-containing polymer in an organic solvent comprising a specific fluorinated acetal, a method for forming a fluorine-containing polymer film using the polymer coating composition, and a method for dissolving and removing the fluorine polymer film using the fluorinated acetal. In particular, the invention provides a top coat for photoresist (lithographic use) and an antireflection film for displays, optical devices, lenses, and the like as well as it also provides a method for forming the same and a method for removing the same.

BACKGROUND ART

Polymer materials frequently have solubility in organic solvents and film-forming methods utilizing the solubility have been used in many industrial fields. For example, they are variously developed in different fields, ranging from large-scale fields, such as building coating materials, automobile coating materials, and industrial coating materials, to water-repellant and oil-repellant agents, fiber-treating agents, antireflection films in various fields, such as photographic films, displays, and optical parts, photoresist materials for semiconductor production, bottom reflection films, top reflection films, recording layer coatings, coating-type light guides, magnetic shields, and the like. In general, organic solvents used for coating of polymer compounds are polar solvents and the compounds are put into practical use after facilitating dissolution of the polymers.

As the polymer to be used after film-formation, a fluorine-containing polymer material may be mentioned. In this case, it becomes possible to impart characteristic properties on the uppermost surface in wide application fields of high-tech materials owing to the characteristics of fluorine atoms, such as water repellency, oil repellency, low water absorbability, water resistance, heat resistance, weather resistance, corrosion resistance, transparency, light sensitivity, low refractivity, and low dielectric property. However, since the material is poor in solubility in an organic solvent, a range of selecting solvents to be used is narrow. Therefore, it is known that the fluorine-containing polymer material is frequently applied using a highly polar alcohol or ketone solvent or a homologous perfluorinated solvent (completely fluorinated solvent).

Industrially, there are limitations that it is necessary for the solvent selected to have an appropriate boiling point in order to perform a suitable coating and flash point is required to be as high as possible in order to perform operations safely. On the other hand, in the case of applying it by coating, in a system of using polar solvents, there are cases that the polar solvents are not suitable for practical use depending on the chemical properties of substrate materials and lower-layer films.

As application fields wherein a fluorine-containing polymer material is applied on an upper part of the other polymer material, there may be mentioned a semiconductor-producing field wherein a fluorine-containing protective film or reflection film is formed an upper part of a photoresist before use. Namely, in recent semiconductor industry, resist materials of fluorine-based compounds have been actively studied as novel materials highly transparent to short-wave UV light such as an $F_2$, ArF, or KrF laser and it has been apparent that transparency at the wavelength used is improved by introducing fluorine atom(s). Therefore, in one useful application field of a fluorine-containing polymer, a developing fluid-soluble photoresist reflection film has been used as a top coat. In this case, application of the top coat suppresses roughness and interference of light. Namely, it is important to increase a fluorine content of the top coat film to lower a refractive index. At the same time, it is necessary to devise prevention of erosion of a photoresist surface which becomes a lower layer at coating. Therefore, in a conventional top coat, there has been used a method of solubilizing a low-molecular-weight fluorine-based acidic substance in a salt form in a water-soluble polymer material and applying it in an aqueous solution form on a photoresist film.

On the other hand, an immersion lithography rapidly becomes conspicuous and, in particular, has attracted as a means for prolonging the exposing technology with an ArF excimer laser in the whole industry. In the immersion exposure, since a photoresist surface comes into contact with an immersion medium (e.g., water), it has been proposed to apply a top coat for protecting the photoresist surface from an immersion fluid such as water as a countermeasure for these various problems (Non-Patent Document 1). The top coat in this case is known to be applied with a perfluorinated solvent (completely fluorinated solvent) or to be applied after dissolving a fluorinated resin containing a fluorine-containing carbinol in an organic solvent containing no fluorine atom.

At the application of a top coat to a photoresist, it is necessary to prevent erosion of the lower-layer photoresist surface at the coating. For the purpose, it is extremely important to select a solvent to be used at the application of the top coat composition. Moreover, as methods for peeling the top coat, there have been reported two methods, i.e., a method for dissolution and peeling with a conventional alkaline developing fluid for photoresists and a method for removal with a special fluorine-containing organic solvent (Non-Patent Document 2).

In general, in the case that the immersion fluid is water, purposes of the polymer protective films are the following two, i.e., a purpose of preventing dissolution of chemical substance(s) from the resist into water and a purpose of preventing penetration of water into the resist. When water penetrates into the underlying photoresist, it is reported that the penetration results in appearance of defects in a resist pattern (Non-Patent Documents 3 and 4).

Furthermore, in a display field, development of large-sized flat displays has been promoted and not only uses for personal computers but also uses for televisions have rapidly expanded. As a result, the market of sophisticated films wherein surface flickering and reflection of sunlight and fluorescent light are reduced is increasingly expanding.

[Non-Patent Document 1] Resist and Cover Material Investigation for Immersion Lithography, 2nd Immersion Work Shop, Jul. 11, 2003

[Non-Patent Document 2] S. Kishimura, et al., Impact of Water and Top-coats on Lithographic Performance in 193-nm Immersion Lithography, Proc. of SPIE, Vol. 5753 (2005), p. 20.

[Non-Patent Document 3] Ralph R. Dammel, et al., Leaching Phenomena and their Suppression in 193 nm Immersion Lithography, J. Photopolymer Sci. and Tech., Vol. 18 (2005), p. 593

[Non-Patent Document 4] M. Maenhoudt, et al., Opportunities and Challenges in Immersion Lithography, J. Photopolymer Sci. and Tech., Vol. 18 (2005), p. 571

SUMMARY OF THE INVENTION

As above, industrial importance to apply a fluorine-containing polymer on an upper part of another organic polymer film is increasingly expanding but there is a large limitation on material design because a polymer is to be coated with a different kind of a polymer. Namely, problems to be solved by the invention are as follows.

A first problem is to solve a disadvantage that an underlying part is eroded or cracked (so-called solvent crack) by the action of a solvent in the case of coating with a fluorine-containing polymer.

A second problem is, in the case of use that the underlying part is a photoresist pursuing sophisticated performance where a fluorine-containing polymer film is formed on the photoresist layer (lower layer), to prevent not only dissolution of the photoresist but also swelling and effusion of added components. In particular, in the case that it is necessary to form the fluorine-containing polymer film with good adhesiveness while an interfacial boundary is surely and clearly discriminated, a range of selecting solvents to be used becomes narrow and, as a result, a type of the necessary fluorine-containing polymer is also limited.

A third problem is, particularly in the case of an immersion lithography as an application field, to provide a method for forming a fluorine-containing polymer protective film for preventing penetration of an immersion fluid to thereby reduce the number of defects in the immersion lithography.

Therefore, it is an important problem to be solved to develop a solution system for coating with a specific fluorine-containing polymer film which is optimized by a method of highly fluorinating the polymer or the like, for example.

A fourth problem is, in the case of peeling and removing the upper-layer fluorine-containing polymer protective film, to provide a method which does not erode the underlying photoresist while using a fluid having a high dissolution ability. Wrong selection of the peeling fluid may result in disadvantages that the photoresist is dissolved, an exposed pattern is distorted, and some defects occur.

Therefore, when an organic solvent system capable of applying without erosion of a photoresist is realized or the upper-layer fluorine-containing polymer film can be peeled and removed without erosion of the photoresist, diversified designs of the fluorine-containing polymer become possible. Thus, there exists industrially a very large demand therefor.

As a result of extensive studies for solving the above-mentioned various problems, the present inventors have found that a solvent comprising a fluorinated acetal having a specific structure is most suitable for the present use and a fluorine-containing polymer coating composition wherein a fluorine-containing polymer is dissolved in the "solvent comprising the fluorinated acetal" is useful. Furthermore, they have found a method for peeling and removing the fluorine-containing polymer film using the "solvent comprising the fluorinated acetal".

Namely, they have found the following means of (I), (II), and (III) and reached accomplishment of the invention.

(I) A polymer coating composition obtainable by dissolving a fluorine-containing polymer compound in a solvent comprising a fluorinated acetal having a specific structure.

(II) A method for forming a fluorine-containing polymer film comprising the following two steps:

(i) a step of applying the polymer coating composition according to the above (I) on an organic film, and (ii) a step of evaporating the "solvent comprising the fluorinated acetal" from the polymer coating composition applied on the organic film to form a fluorine-containing polymer film.

(III) A method for forming a photoresist or a lithographic pattern, which comprises performing exposure as lithography from an upper part of a fluorine-containing polymer film formed on a photoresist film, successively bringing the film into contact with the above solvent comprising the fluorinated acetal and peeling and removing the fluorine-containing polymer film.

It has been found that, by adopting the polymer coating composition, it is possible to suitably form a fluorine-containing polymer film as an upper layer even when the lower layer is an organic substance or a polymer film which is apt to be dissolved. Furthermore, even when the fluorine-containing polymer to be used as the upper layer is a fluorine-containing polymer having a cyclic structure, a sufficient dissolution can be exhibited and it becomes possible to prepare functional multilayer films useful in the fields of optical parts, displays, and lithography. Moreover, since a partially fluorinated acetal has a high flash point as compared with a corresponding hydrocarbon ether, the acetal has an advantage of a high safety in use.

Furthermore, even when the polymer has one or more kinds of alkali-soluble groups such as a fluorocarbinol group, a sulfonylamide group, a fuluoroalkylsulfonic acid group, or a carboxyl group in the molecule, it has been found that a coating film can be easily formed on a photoresist film by dissolving the fluorine-containing polymer in the fluorinated acetal.

Moreover, it has been found that a coating film can be easily formed on a photoresist film even when the polymer is an alkali-insoluble fluorine-containing polymer containing a small amount of an alkali-soluble group or no alkali-soluble group.

On the other hand, in the case of peeling and removing the upper-layer fluorine-containing polymer film, it has been found that the above-mentioned "solvent comprising the fluorinated acetal" functions extremely suitably as a solvent for peeling, which does not erode the lower-layer photoresist. Thereby, it becomes possible to peel and remove the upper layer with maintaining the performance of the lower layer. As a method for removing the polymer film formed on the photoresist film, i.e., a protective film or a reflection film as above, the solvent is particularly effective in the immersion lithography field.

The "coating composition containing a fluorinated acetal having a specific structure as a constitutional component" of the invention suitably forms an upper layer (protective film) formed of a fluorine-containing polymer film even when a lower layer is an organic substance or polymer which is apt to be dissolved. In the case that the lower layer is a photoresist film, the protective film can be removed by bringing it into contact with the "solvent comprising the fluorinated acetal" without impairing the lower layer. As a result, a resist pattern or a lithographic pattern having a reduced defects and high resolution can be formed.

Furthermore, even when the polymer to be used for the upper layer is a fluorine-containing polymer or a fluorine-containing polymer having a cyclic structure, the fluorinated acetal having a specific structure can exhibit a sufficient dissolution ability and enable formation of diversified functional multilayer film suitable in the display or lithography fields.

DETAILED DESCRIPTION OF THE INVENTION

The following will describe modes for carrying out the invention in detail in the order of the above-mentioned (I), (II), and (III) which are a group constituting the invention.

First, the fluorine-containing polymer coating composition of (I) will be described The fluorinated acetal usable in the invention has a structure represented by the formula (1):

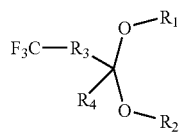
(1)

wherein $R_1$ and $R_2$ are the same or different kinds of hydrocarbon groups having 1 to 12 carbon atoms, which may have a branch or a cyclic structure; $R_1$ and $R_2$ may be bonded to form a ring; $R_3$ is a single bond or an alkylene group which may have a branch having 1 to 4 carbon atoms; $R_4$ is a hydrogen atom, a methyl group, a trifluoromethyl group, or a trifluoroethyl group; and a fluorine atom, a nitrogen atom, an oxygen atom, a sulfur atom, a hydroxy group, a carboxyl group, a glycidyl group, a cyano group, an amino group, and/or a fluorocarbinol group may be present in part of $R_1$, $R_2$, and/or $R_3$.

Among them, a fluorinated acetal wherein $R_4$ is a hydrogen atom, represented by the formula (1a) can more effectively enhance the solubility of the fluorine-containing polymer compound and hence can be mentioned as a preferred solvent for polymer compounds having a wide range of fluorine content:

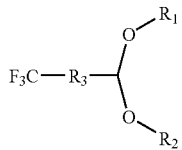
(1a)

wherein the meanings of $R_1$, $R_2$, and $R_3$ are same as in the formula (1).

More suitable fluorinated acetals are compounds represented by the formulae (3), (4), and (5):

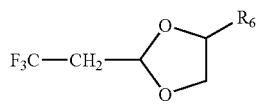
(3)

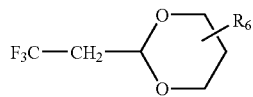
(4)

In the formulae (3) and (4), $R_6$ is a hydrogen atom, a methyl group, or an ethyl group.

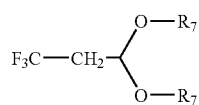
(5)

wherein $R_7$ represents an alkyl group which may have a branch having 1 to 5 carbon atoms and may have a fluorine atom.

Concrete examples thereof include the following compounds. However, they are not limited thereto.

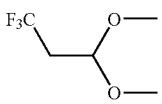 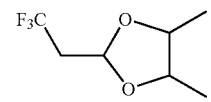

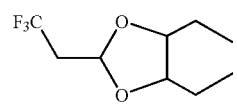 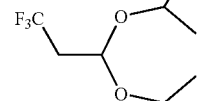

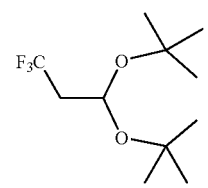

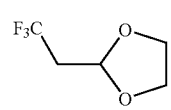 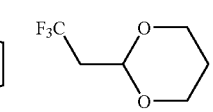 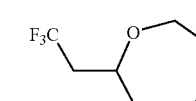

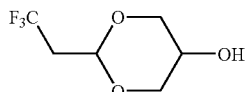 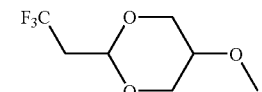

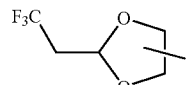 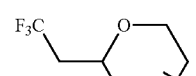

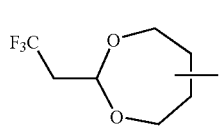

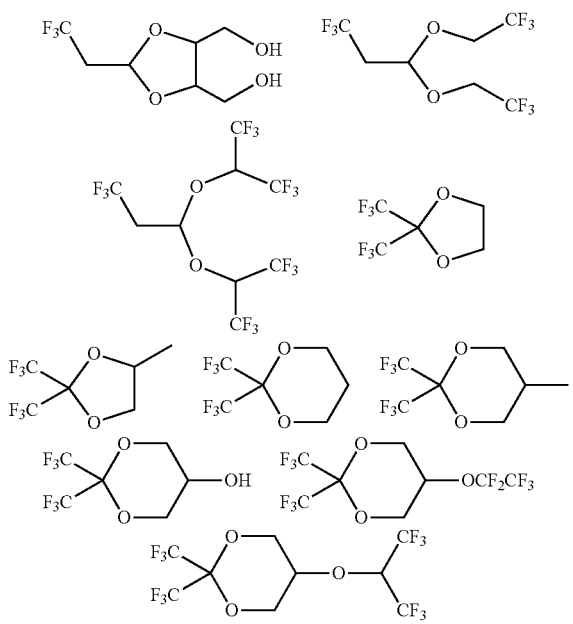

The process for synthesizing the fluorinated acetal of the formula (1) according to the invention is not particularly limited but the following process may be mentioned, for example.

Synthetic Process 1

A process wherein 1-chloro-3,3,3-trifluoropropene is reacted with an alcohol in the presence of a basic substance such as sodium hydroxide to obtain a vinyl ether, which is then reacted with an alcohol under an acidic or neutral condition to obtain an acetal.

Synthetic Process 2

A process wherein 1-chloro-3,3,3-trifluoropropene is reacted with a glycol in the presence of a basic substance such as sodium hydroxide to obtain an acetal.

solubility. However, as the organic solvent usable as a mixture therewith, it is important that the mixed solvent is difficult to erode a lower-layer resist film or to extract an additive or the like from the resist film. Therefore, in the invention, the fluorinated acetal is preferably present in an amount of 60% by weight or more, preferably 80% by weight or more in the whole solvent.

As the solvent to be mixed with the fluorinated acetal, a solvent having a boiling point range suitable for spin coating, i.e., having a boiling point of about 30° C. to 220° C. is suitably selected. Concretely, hydrocarbon solvents, alcohols, ethers, esters, fluorinated solvents, and the like are preferred. Preferably, alkanes such as pentane, hexane, heptane, octane, nonane, and decane, alicyclic hydrocarbon solvents, and hydrocarbon-based alcohols such as butanol, methyl ethyl carbinol, pentanol, amyl alcohol, hexyl alcohol, and heptyl alcohol are suitably adopted. In the case of alcohols, primary, secondary, and tertiary alcohols can be selected. Furthermore, as the other solvent usable, ketones such as acetone, methyl ethyl ketone, methyl isobutyl ketone, and cyclohexanone, esters such as ethyl acetate, isobutyl acetate, and butyl acetate, cyclic ethers such as tetrahydrofuran, propylene glycol methyl ether acetate, ethyl lactate, and the like can be widely applied.

The following will concretely describe the fluorine-containing polymer to be used in the invention. The fluorine-containing polymer is not particularly limited as far as it can be dissolved in an organic solvent containing a fluorinated acetal to be used and is a polymer material partially containing fluorine atom(s). However, a non-polar perfluoropolymer such as polytetrafluoroethylene is difficult to be dissolved in the fluorinated acetal and hence is not preferred. The basis of selection can be represented by a fluorine content and the fluorine content of the fluorine-containing polymer suitably usable is from 3% by weight to 70% by weight. When the content is less than 3% by weight or more than 70% by weight, the fluorine-containing polymer is difficult to be dissolved in the fluorinated acetal or a mixed solvent system containing the fluorinated acetal of the invention depending

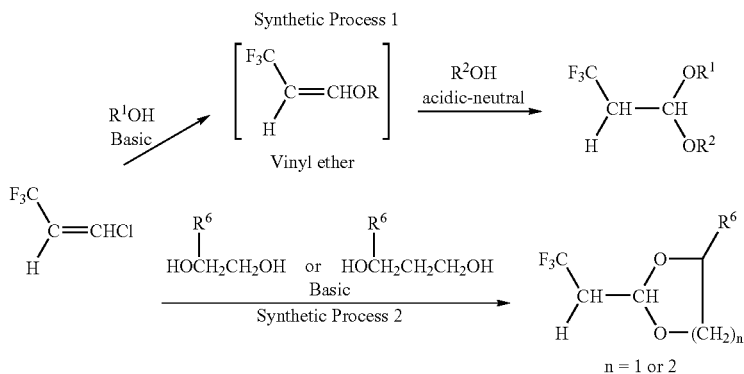

The fluorinated acetal of the invention may be used singly or is preferably used as a solvent mixed with another fluorinated acetal. The selection of single use or mixed use may be optimized in consideration of the polarity level of the fluorine-containing polymer to be used. For example, in the case of a fluorine-containing polymer whose affinity to the fluorinated acetal is high but which is difficult to be completely dissolved by the fluorinated acetal alone, it may be mixed with any organic solvent for the purpose of assisting the on the structure. In addition, when an amount of the fluorinated acetal to be mixed is reduced and an amount of a polar solvent is increased for the purpose of enhancing solubility, there is a possibility that the underlying organic film is eroded, so that the cases are not preferred.

Specific example of the fluorine-containing polymer usable in the invention include polymers or copolymers of one or more monomers selected from fluorine-containing olefins, fluorine-containing acrylic acids, fluorine-containing methacrylic acids, fluorine-containing acrylic esters, fluorine-containing methacrylic esters, α-CF$_3$-acrylic esters, α-fluoroacrylic esters, fluorine-containing norbornene compounds, fluorine-containing styrene-based compounds, fluorine-containing vinyl esters, fluorine-containing vinyl esters, fluorine-containing allyl ethers, and the like. In the case of the copolymers, a comonomer which may or may not contain fluorine atom(s) can be used.

The method of incorporating fluorine atom(s) usable in the invention is not particularly limited but there may be suitably adopted materials containing a fluorine-containing group comprising bond(s) such as —CF$_2$—, —CFH—, —CF$_3$, —CHF$_2$, —COF, and —SO$_2$F and/or combinations thereof.

Examples of the structures of preferable repeated units of the fluorine-containing polymer compounds include the following.

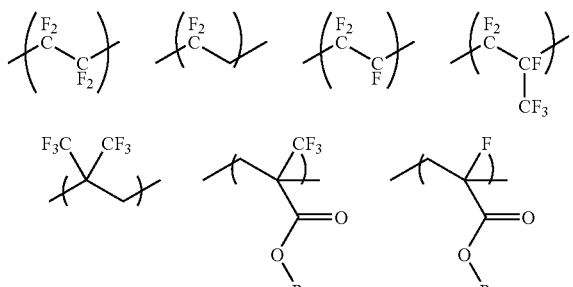
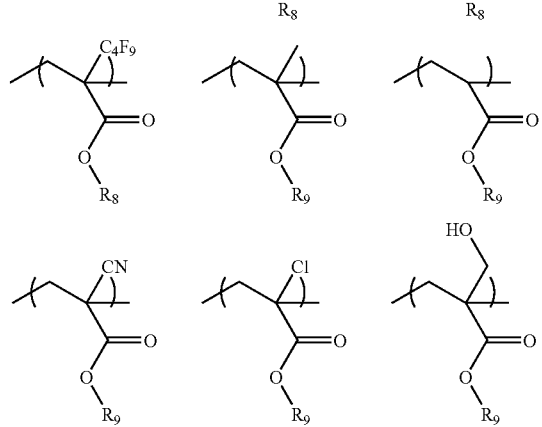
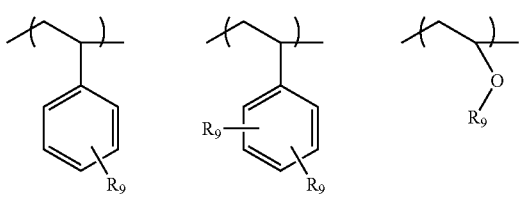
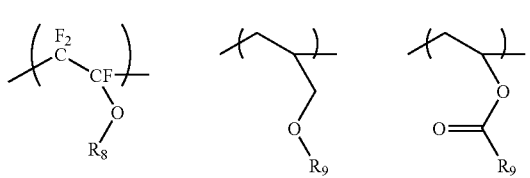

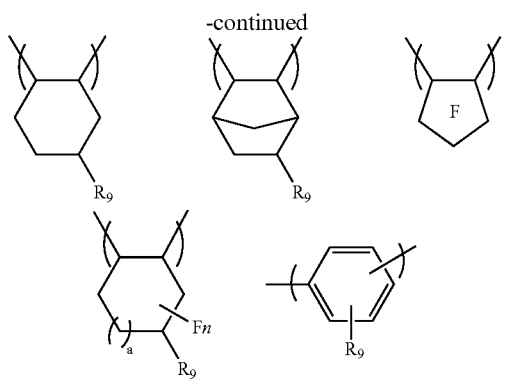

In the examples as above, R$_8$ is an alkyl group, an alkylene group, an alicyclic group, or an aromatic group which may contain a fluorine atom, which may contain a hydroxy group, an amino group, a carboxyl group, a cyano group, a fluorocarbinol group, an amide group, a sulfonic acid group, an ester, and/or the like. R$_9$ is an alkyl group, an alkylene group, an alicyclic group, or an aromatic group containing a fluorine atom in part thereof, which may contain a hydroxy group, an amino group, a carboxyl group, a cyano group, a fluorocarbinol group, an amide group, a sulfonic acid group, an ester, a carbonyl, an ether, and/or the like. Sign a represents an integer of 0 to 2 and F$_n$ represents the fact that part or all of the hydrogen atoms in the ring are substituted by fluorine atom(s), wherein n represents a positive integer.

In the case that a fluorine-containing olefin is used, it is desirably a copolymer for the purpose of decreasing crystallinity and enhancing solubility. As the fluorine-containing olefin usable, there may be suitably mentioned tetrafluoroethylene-based polymers, trifluoroethylene copolymers, vinyl fluoride copolymers, vinylidene fluoride copolymers, hexafluoropropylene-based polymers, perfluorovinyl ether-based polymers, hexafluoroisobutene-based polymers, chlorotrifluoroethylene-based polymers, octafluorocyclopentane-based polymers, and the like.

In the case that the fluorine-containing polymer is made alkali-soluble or in the case that the fluorine-containing polymer is designed so as to enhance adhesiveness before use, it is possible to incorporate a functional group having one or two or more fluorocarbinols selected from trifluoroalcohols, hexafluoroalcohols, and heptafluoroalcohols, fluoroalkylsulfonamide groups, and/or carboxyl groups in part of the fluorine-containing polymer, particularly in R$_8$ or R$_9$ in the repeated unit of the above-mentioned fluorine-containing polymer. In this case, by increasing the amount of these functional groups, the fluorine-containing polymer can be converted into a fluorine-containing polymer solubilized in an alkali developing fluid.

In particular, especially suitable one is a fluorine-containing polymer having a group represented by the following formula (2):

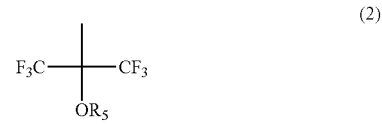

(2)

wherein R$_5$ is a hydrogen atom, a methyl group, an ethyl group, a propyl group, a cyclohexyl group, a methyl acetal, an ethyl acetal, a norbornane acetal, a butoxy carbonate, or any protective group which may contain a cyclic structure having 1 to 15 carbon atoms, which may contain fluorine atom(s). However, in order to convert the polymer into alkali-soluble one, $R_5$ is most suitably a hydrogen atom.

Other than the group represented by the formula (2), concrete examples of the alkali-soluble group suitably usable or an adhesive group include the following.

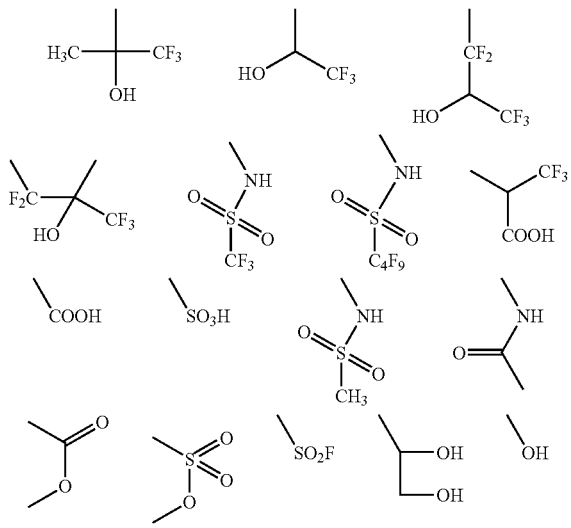

The following will describe compositional elements of the copolymer for the fluorine-containing polymer usable in the invention. Copolymerization includes a case of copolymerizing a plurality of the above-mentioned fluorine-containing monomers or a case of copolymerizing the above-mentioned fluorine-containing monomer and the other monomer containing no fluorine atom.

As the other party of copolymerization usable, there may be used one or more monomers selected from olefins, acrylic acid, methacrylic acid, acrylic esters, methacrylic esters, norbornene compounds, styrene-based compounds, vinyl ethers, cyclic vinyl ethers, acrylonitrile, allyl ethers, vinyl silanes, maleic anhydride, vinylpyrrolidone, vinylsulfonic acid, and vinylsulfonic esters.

Examples of the olefin include ethylene, propylene, and the like.

Moreover, as the acrylic esters or methacrylic esters, any ester side chains can be used without particular limitation. As examples of known compounds, alkyl esters of acrylic or methacrylic acid, such as methyl acrylate or methacrylate, ethyl acrylate or methacrylate, n-propyl acrylate or methacrylate, isopropyl acrylate or methacrylate, n-butyl acrylate or methacrylate, isobutyl acrylate or methacrylate, n-hexyl acrylate or methacrylate, n-octyl acrylate or methacrylate, 2-ethylhexyl acrylate or methacrylate, lauryl acrylate or methacrylate, 2-hydroxyethyl acrylate or methacrylate, and 2-hydroxypropyl acrylate or methacrylate; acrylates or methacrylates containing ethylene glycol, propylene glycol, or tetramethylene glycol; unsaturated amides, such as acrylamide, methacrylamide, N-methylol-acrylamide, N-methylol-methacrylamide, and diacetone-arylamide; acrylonitrile, methacrylonitrile, vinylsilanes and acrylic or methacrylic esters containing alkoxysilane, t-butyl acrylate or methacrylate, 3-oxocyclohexyl acrylate or methacrylate, adamantyl acrylate or methacrylate, alkyladamantyl acrylate or methacrylate, cyclopentyl or cyclohexyl acrylate or methacrylate, cyclopentyl or cyclohexyl acrylate or methacrylate having one or two hydroxy groups, adamantyl acrylate or methacrylate having one or two hydroxy groups, tricyclodecanyl acrylate or methacrylate, butyrolactone, acrylates or methacrylates having a special lactone ring simultaneously having a norbornane ring and a lactone ring, acrylates or methacrylates wherein a norbornane ring is directly or indirectly esterified, acrylic acid, and methacrylic acid can be used. The above-mentioned various cyclic acrylates or methacrylates may be any form of primary, secondary, or tertiary esters. Moreover, various acrylates, methacrylates, norbornenes, and styrenes having sulfonic acid, carboxylic acid, a hydroxyl group, and/or a cyano group in the side chain may be also used.

Furthermore, it is also possible to copolymerize the above-mentioned acrylate compounds containing an α-cyano group and maleic acid, fumaric acid, maleic anhydride, and the like as analogous compounds. In addition, there may be suitably used monomers wherein part of the hydrogen atoms of the above-mentioned copolymerizable monomers is replaced by fluorine atom(s).

Moreover, after maleic anhydride is copolymerized, a monomer represented by the formula esterified with one or two alcohols is also preferably adopted.

According to the invention, a polymer coating composition capable of forming a coating film on an organic film such as a photoresist, a resin film, or the other base material without eroding the lower-layer base material can be provided by mixing the above-mentioned fluorine-containing polymer compound with the fluorinated acetal of the formula (1) or an organic solvent into which the fluorinated acetal is incorporated to dissolve the polymer compound therein.

According to the invention, the fluorine-containing polymer compound is used after dissolved in a solvent comprising the fluorinated acetal of the formula (1). As the dissolution step, there may be applied a method of polymerization in the "solvent comprising the fluorinated acetal" in the production step of the fluorine-containing polymer or a method of dissolving the polymer in the solvent or replacing a solvent with the solvent after polymerization. Moreover, a method of mixing the fluorine-containing polymer once produced with the fluorinated acetal and dissolving the polymer with stirring at room temperature or under heating is generally adopted. Also, in the case of using a mixed solvent, there may be mentioned a method of producing a solution using the mixed solvent or a method of adding another solvent at final adjustment of solid matter concentration.

An optimum solid matter concentration in the invention is selected depending on the film thickness and coating method to be used, the molecular weight of the fluorine-containing polymer, and the like but, in general, the concentration is preferably in the range of 1 to 40% by weight. For example, in the case of the fluorine-containing polymer having a molecular weight of 10,000 to 50,000 and in the case that a protective film or antireflection film having a thickness of 20 to 100 nm is needed, a solid matter concentration of about 2 to 15% by weight is suitably adopted.

The following will describe (II) the method for forming the fluorine-containing polymer film comprising two steps.

(i) The first step is a step of applying the "fluorine-containing polymer coating composition" on an organic film as described in the invention group (I).

(ii) The second step is a step of evaporating the "solvent comprising the fluorinated acetal" from the polymer coating composition applied on the organic film to form a fluorine-containing polymer film.

As the "fluorine-containing polymer coating composition" in the invention group (II), those described in the above (I) can be used.

As the applying method of (i), a still-standing casting method, a spin-coating method, a flow-coating method, a spray-coating method, a bar-coater method, and the like can be used without limitation. Preferred is a spin coating method in the case of use in semiconductor-producing process and a spray-coating method or a bar-coater method in the case of antireflection use for displays. After application of (ii), the composition can be dried at room temperature or under heating under normal pressure or reduced pressure to form a fluorine-containing polymer film.

The polymer coating composition for photoresist according to the invention can be used on any kinds of lower-layer organic films without limitation. Namely, any organic resists can be adopted as the lower-layer films including KrF resists wherein the photoresist is hydroxystyrene-based one and ArF resists formed of methacrylic esters or acrylic esters, regardless of kind and structure of polymer materials. As light sources other than KrF and ArF, I line, G line, F2 laser, actinic energy line such as an electron beam or X-ray, or the like can be used. As photosensitive systems, the composition can be used without depending on negative-type or positive-type exposure-changing systems and can be applied to monolayer resists, two-layer resists, and hard mask-type multilayer resist systems.

In the case that the lower layer is a photoresist organic film, the polymer coating composition wherein the fluorinated acetal of the invention is used as a solvent is capable of inhibiting erosion and dissolution of the lower layer to the minimum level at its application and hence resolution of the photoresist can be enhanced.

The composition of the invention is suitably applied even in the immersion lithography and can protect a photoresist film from water or an immersion fluid. In addition, by using the fluorine-containing polymer compound having an enhanced water repellency and oil repellency, it becomes possible to efficiently protect the resist film from water or an immersion fluid and to reduce defects.

The following will describe substrates in the case of use for displays, optical parts, and the like. Namely, as underlying substrates for forming antireflection films, antifouling films, water-repellent and oil repellent films, weather-resistant films, and the like, a wide range of materials, such as acrylic resins, MS resins (methacrylic ester/styrene copolymers), epoxy resins, polyester resins, styrene resins, polyethylene resins, cellulose resins, polyamide resins, polyimide resins, polycarbonate resins, polyether resins, polyvinyl alcohol resins, butyral resins, and silicon resins, can be used as materials for various films or molded articles. Moreover, in the case that a design or a recorded layer is formed with printing ink, pigment, toner, paint, or the like on a base material, it is also possible to use a thin film having an enhanced refractive index by the use of Br or sulfur, an information recording paper, an electrostatic recording paper, or the like as the base material.

The following will describe (III) the method for forming a photoresist or a lithographic pattern, which comprises, in a step after exposure from an upper part of a fluorine-containing polymer film formed on a photoresist film, bringing the film into contact with the above solvent comprising a specific fluorinated acetal and peeling and removing the fluorine-containing polymer film.

As the "solvent comprising a fluorinated acetal" in (III), the same kind of solvents as those described in the invention group (I) can be used. Namely, the "fluorinated acetal" is a compound represented by the formula (1) and there may be mentioned preferably those described in the formula (1a), more preferably those described in the formulae (3) to (5). They may be used singly or may be also used as a mixture with various solvents described in the invention group (I). In this case, as in the case of (I), the content of the fluorinated acetal in the whole solvent is preferably 60% by weight or more, more preferably 80% by weight or more.

In the invention, the fluorine-containing polymer film capable of being peeled off and removed by the fluorinated acetal can be suitably adopted even in the case that the fluorinated acetal is not used at coating, that is, the case that the polymer is applied with a solvent system using an organic solvent other than the fluorinated acetal or water, as far as the fluorine-containing polymer is dissolved in the fluorinated acetal.

As the fluorine-containing polymer compound, a compound having a functional group of the formula (2) is suitable, and particularly preferred are various fluorine-containing polymer compounds described in the invention group (I).

In the photolithographic use, the polymer compound is used in the following order: (1) a step of applying the fluorinated acetal solution of the fluorine-containing polymer on a photoresist film, (2) a step of exposing the photoresist through the fluorine-containing polymer film by means of an exposing machine or an immersion exposing machine, (3) a step of thermal treatment for chemical amplification which promotes acid elimination of the photoresist or a step of accelerating a crosslinking reaction in the case of a negative type, (4) a step of peeling the fluorine-containing polymer, and (5) a step of obtaining a resist pattern at the photoresist layer through alkaline development and a rinsing step. On this occasion, when the upper-layer fluorine-containing polymer is alkali-soluble, the fluorine-containing polymer film (upper layer) and acid-eliminated parts of the lower-layer photoresist layer (exposed parts in the case of a positive type) can be developed and peeled off in one step using an aqueous tetramethylammonium hydroxide solution or the like which is a usual alkaline developing fluid. In this case, the aforementioned steps (4) and (5) are performed as one step.

However, the fluorine-containing polymer, regardless of alkali-soluble one or alkali-insoluble one, can be peeled off and removed, with hardly eroding the lower-layer resist layer and with suppressing decrease in film weight of the resist film, by passing the "solvent comprising a fluorinated acetal" according to the invention from an upper part and bringing it into contact with the fluorine-containing polymer to dissolve it. This method becomes an effective method for suppressing defects in the immersion lithography.

According to the invention, the method for peeling the fluorine-containing polymer can be selected depending on the chemical structure and properties of the fluorine-containing polymer. For example, in the case that the fluorine-containing polymer is alkali-soluble, as the fluid for dissolution and peeling, not only the fluorinated acetal of the invention but also an aqueous tetramethylammonium hydroxide solution or the like which is a usual alkaline developing fluid can be suitably selected. However, in the case that it is intended to impart surface properties such as hydrophobicity and water repellency and lower a defective ratio at immersion by increasing the fluorine content of the fluorine-containing polymer, a peeling solvent comprising the fluorinated acetal of the invention is more preferably adopted. Namely, regardless of the degree of alkali-solubility of the fluorine-containing polymer, the fluorine-containing polymer film can be effectively removed.

In addition, according to the invention, in the case of the presence of extracted substance(s) from the lower layer, for the purpose of reducing the influence to a minimum level, it is possible to add additives such as a photoacid generating agent, a photobase generating agent, an amine compound, and a quencher into the fluorine-containing polymer coating composition beforehand. Particularly, in the case of adding a photoacid generating agent in the invention, an effect of enhancing a resolution performance of the lower-layer resist in the immersion lithography is exhibited.

Furthermore, a hydrophobic additive for suppressing influence to swelling and penetration of water, a surfactant, an acidic additive for promoting dissolution into a developing fluid, and the like can be suitably used.

EXAMPLES

Synthetic Example 1

Synthesis of Fluorinated Acetal (A)

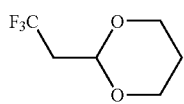
(A)

Into a 300 mL stainless-steel autoclave cooled with dry ice and acetone was charged a solution of 25.8 g (0.46 mol) of KOH dissolved in 52.5 g (0.69 mol) of 1,3-propanediol and 4.2 g of water beforehand and 30 g (0.23 mol) of (1Z)-1-chloro-3,3,3-trifluoropropene. After temperature was elevated to around 20° C., the whole was stirred for 1 hour and then heated under stirring at 88° C. for 10 hours. When the reaction solution was measured by gas chromatography, other than excess 1,3-propanediol, it contains 1.0% of starting (1Z)-1-chloro-3,3,3-trifluoropropene, 82.0% of 2-(2,2,2-trifluoroethyl)-1,3-dioxane, and 17.0% of others.

After precipitated salts were filtered off, a fraction of 76° C. to 78° C./16 kPa was collected by distillation to obtain 21.5 g (purity 99%, yield 54.4%) of 2-(2,2,2-trifluoroethyl)-1,3-dioxane (fluorinated acetal (A)).
Boiling point: 137° C.
Flash point: 41.0-41.5° C.

Synthetic Example 2

Synthesis of Fluorinated Acetal (B)

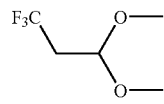
(B)

Into a 1 L stainless-steel autoclave cooled with dry ice and acetone was charged a solution of 86 g (1.53 mol) of KOH dissolved in 237 g (7.40 mol) of methanol and 10 g of water beforehand and 100 g (0.77 mol) of (1Z)-1-chloro-3,3,3-trifluoropropene. After temperature was elevated to around 22° C., the whole was stirred for 1 hour and then heated under stirring at 70° C. for 1.5 hours. When the reaction solution was measured by gas chromatography, other than excess methanol, it contains 2.0% of starting (1Z)-1-chloro-3,3,3-trifluoropropene, 83.6% of (1Z)-3,3,3-trifluoro-1-methoxypropene, 10.3% of (1E)-3,3,3-trifluoro-1-methoxypropene, and 4.1% of 1,1,1-trifluoro-3,3-dimethoxypropane.

After precipitated salts were filtered off, a fraction of 80° C. to 110° C. was collected by flush distillation to obtain 190 g of a mixture. Into the resulting mixture was charged 16.5 g of methanesulfonic acid (0.172 mol), followed by heating under stirring at 70° C. for 4 hours. When the reaction solution was measured by gas chromatography, other than excess methanol, it contains 0.9% of starting (1Z)-1-chloro-3,3,3-trifluoro-1-methoxypropene, 97.6% of 1,1,1-trifluoro-3,3-dimethoxypropane, and 1.5% of others. Thereto was added 150 g of water and the whole was stirred, followed by separation into two layers. The resulting organic layer was dried over 10 g of molecular sieves 4A and then the molecular sieves 4A was filtered off to obtain 77 g of a mixture.

After 77 g of the resulting mixture was subjected to rectification using an about 15-plate distillation tower packed with stainless-steel irregular packings and a fraction of 89° C. to 90° C. was collected to obtain 65.5 g (purity 99.9%, yield 53.8%) of 1,1,1-trifluoro-3,3-dimethoxypropane (fluorinated acetal (B)).
Boiling point: 90.5-91.0° C.
Flash point: 16.5-17.0° C.

Synthetic Example 3

Synthesis of Fluorinated Acetal (C)

(C)

Into a 300 mL stainless-steel autoclave cooled with dry ice and acetone was charged a solution of 38.7 g (0.69 mol) of KOH dissolved in 71.4 g (1.15 mol) of ethylene glycol beforehand and 30 g (0.23 mol) of (1Z)-1-chloro-3,3,3-trifluoropropene. After temperature was elevated to around 22° C., the whole was stirred for 1 hour and then heated under stirring at 60° C. for 4 hours. When the reaction solution was measured by gas chromatography, other than excess ethylene glycol, it contains 2.0% of starting (1Z)-1-chloro-3,3,3-trifluoropropene, 80.0% of 2-(2,2,2-trifluoroethyl)-1,3-dioxolane, and 18.0% of others.

After precipitated salts were filtered off, a fraction of 80° C. to 100° C./13 to 16 kPa was collected by distillation to obtain 19.1 g (purity 99%, yield 53.2%) of 2-(2,2,2-trifluoroethyl)-1,3-dioxolane (fluorinated acetal (C)).
Boiling point: 120° C.
Flash point: 33.0-33.5° C.

Synthetic Example 4

Synthesis of Fluorinated Acetal (D)

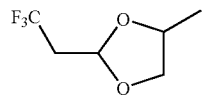
(D)

Into a 300 mL stainless-steel autoclave cooled with dry ice and acetone was charged a solution of 25.8 g (0.46 mol) of KOH dissolved in 52.5 g (0.69 mol) of 1,2-propanediol and 4.2 g of water beforehand and 30 g (0.23 mol) of (1Z)-1-chloro-3,3,3-trifluoropropene. After temperature was elevated to around 20° C., the whole was stirred for 1 hour and then heated under stirring at 60° C. for 18 hours. When the reaction solution was measured by gas chromatography, other than excess 1,2-propanediol, it contains 5.0% of starting (1Z)-1-chloro-3,3,3-trifluoropropene, 75.0% of 4-methyl-2-(2,2,2-trifluoroethyl)-1,3-dioxolane, and 20.0% of others.

After precipitated salts were filtered off, a fraction of 85° C. to 87° C./30 kPa was collected by distillation to obtain 21.0 g (purity 97%, yield 52.1%) of 4-methyl-2-(2,2,2-trifluoroethyl)-1,3-dioxolane (fluorinated acetal (D)).

Flash point: 32.0-33.0° C.

Synthetic Example 5

Synthesis of Fluorinated Acetal (E)

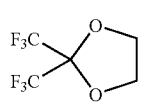
(E)

Into a 300 mL three-necked flask equipped with a gas-inlet tube, a reflux condenser, and a thermometer was charged 10.0 g (0.12 mol) of ethylene chlorohydrin beforehand, followed by cooling with ice. Then, 20.0 g (0.12 mol) of hexafluoroacetone was added through the gas-inlet tube. After completion of the addition, the whole was stirred for 15 minutes as it was and then 100 mL of t-butyl methyl ether was added. Then, 16.6 g (0.12 mol) of potassium carbonate was added portionwise over a period of 1 hour and, after completion of the addition, the whole was stirred as it was. The resulting mixture was poured into 100 mL of water and an organic layer was separated by two-layer separation in a separating funnel. The resulting organic layer was subjected to distillation under normal pressure to collect a fraction of 106° C. to 107° C. to obtain 15.8 g (purity 99%, yield 62.0%) of 2,2-bis(trifluoromethyl)-1,3-dioxolane (fluorinated acetal (E)).

Synthetic Example 6

[Synthesis of Fluorine-Containing Polymer Compound]

In a 500 mL flask equipped with a reflux condenser and a stirring bar were placed the compound (M-1) (50 g), azobisisobutyronitrile (AIBN) (0.8 g), n-dodecyl mercaptan (1.0 g), and methyl ethyl ketone (200 mL), followed by replacing the atmosphere of the flask with nitrogen. The mixture was heated on an oil bath at 75° C. and stirred for 18 hours. After completion of the reaction, the reaction solution was stirred after addition of n-hexane (1600 mL) and formed precipitate was taken out by filtration. The precipitate was dried at 50° C. for 20 hours to obtain a polymer compound (P-1) (41 g) as a white solid. Polymerization average molecular weight determined on GPC (standard polystyrene) was 8,700 and molecular weight dispersity was 1.69.

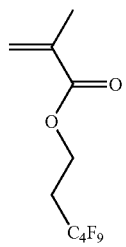
(M-1)

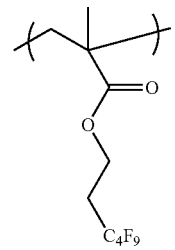
(P-1)

Synthetic Example 7

[Synthesis of Fluorine-Containing Polymer Compound]

Various types of polymerization or copolymerization were carried out in a similar manner to the method described in Synthetic Example 6 using various monomers (M-2) to (M-8) to obtain white solid polymer compounds (P-2) to (P-7) as white solids. Polymerization average molecular weight determined on GPC (standard polystyrene), molecular weight dispersity, and copolymerization ratio a:b are shown in Table 1.

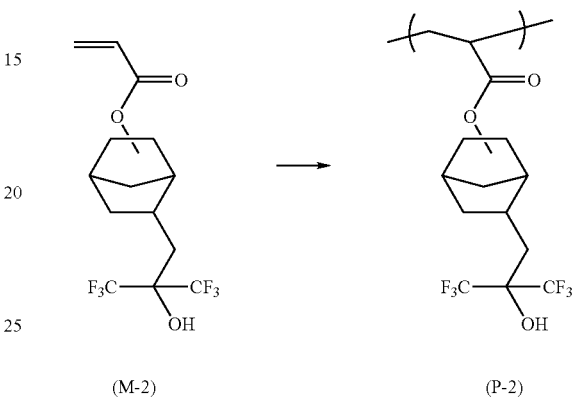
(M-2)  (P-2)

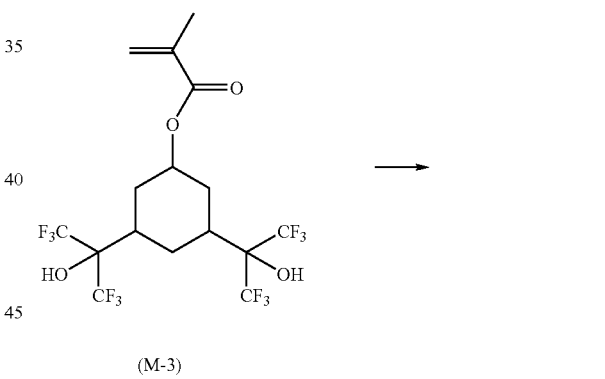
(M-3)

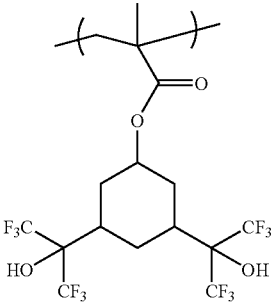
(P-3)

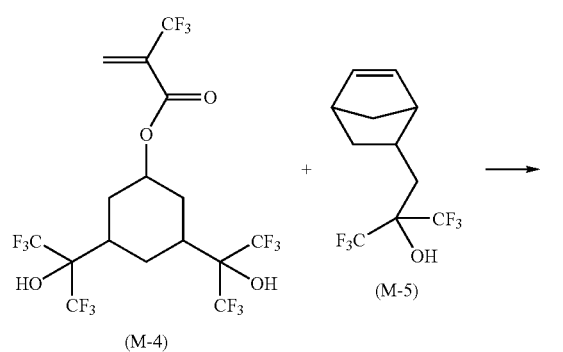

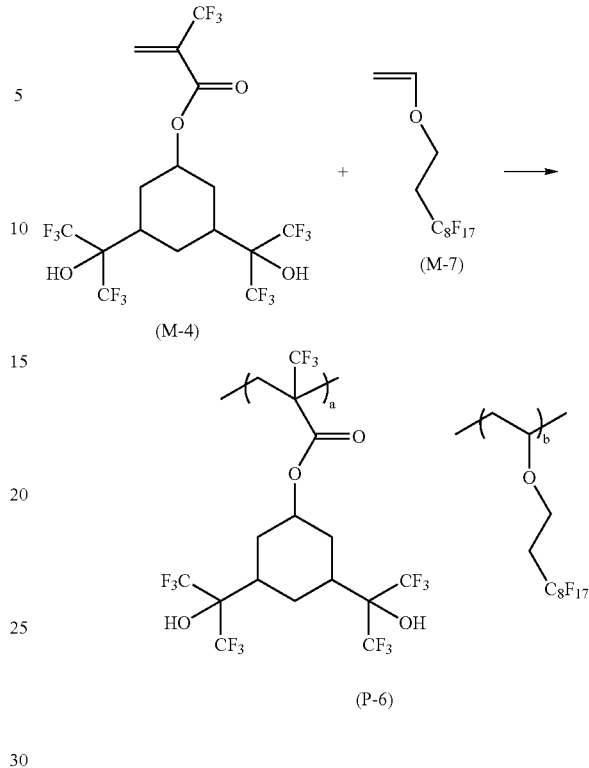

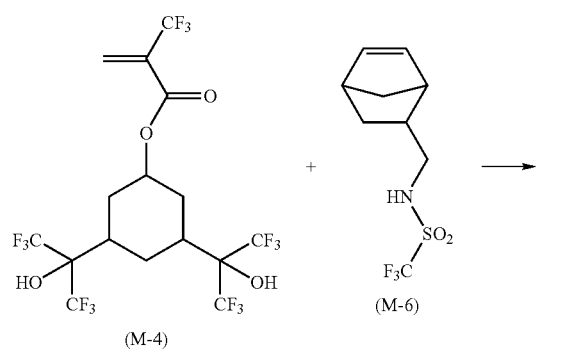

TABLE 1

| Polymer | a | b | Molecular weight | Dispersity |
|---|---|---|---|---|
| P-1 | Homopolymer | | 8,700 | 1.69 |
| P-2 | Homopolymer | | 25,100 | 1.76 |
| P-3 | Homopolymer | | 19,700 | 1.46 |
| P-4 | 71 | 29 | 12,500 | 1.33 |
| P-5 | 67 | 33 | 11,600 | 1.38 |
| P-6 | 51 | 49 | 9,300 | 2.11 |
| P-7 | 47 | 53 | 6,800 | 1.65 | a:b is shown by mol %

Synthetic Example 8

[Polymerization and Production of Photoresist]

A copolymerization reaction was carried out in a similar manner to the method described in Synthetic Example 6 using three components of monomers (M-9), (M-10), and (M-11) to obtain a polymer compound (P-8) suitable as a resist for ArF excimer laser. Polymerization average molecular weight determined on GPC (standard polystyrene) was 12,800 and molecular weight dispersity was 1.84.

Then, the polymer compound (P-8) was dissolved in propylene glycol methyl acetate and the content of the solid matter was adjusted to be 12%. Triphenyl sulfonium triflate (TPS105: manufactured by Midori Kagaku Co., Ltd.) was further dissolved as a photoacid generating agent in an amount of 2 parts by weight relative to 100 parts by weight of the polymer compound (P-8) to prepare a resist solution.

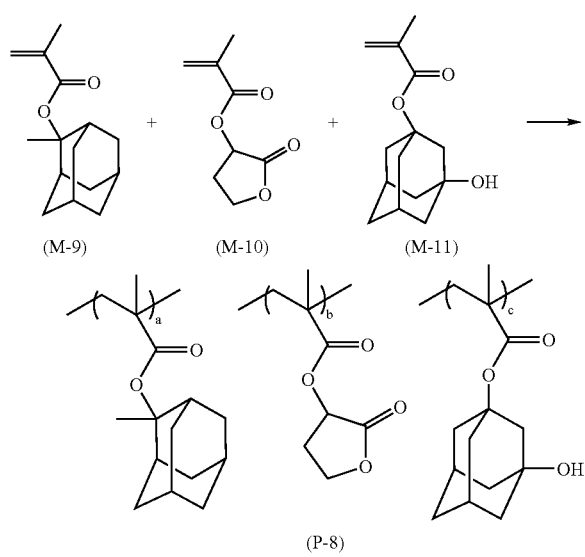

Examples 1 to 9

[Preparation and Application of Polymer Coating Composition]

Each of the fluorine-containing polymers (P-1) to (P-7) obtained in Synthetic Examples 6 and 7 was dissolved in a solvent composition containing a fluorinated acetal whose composition is shown in Table 2 (the solvent to be mixed with the fluorinated acetal was incorporated in an amount of 10% by weight relative to the whole solvent composition) and the content of the solid matter was adjusted to be 5%. In all cases, homogeneous and transparent polymer solutions were obtained.

Then, a 4-inch silicon wafer was spin-coated with each of the solutions at 1500 rpm for 60 seconds and then dried at 80° C. for 120 seconds to obtain homogeneous and transparent films in Examples 2 to 7 and Example 9. Thickness of each film is shown in Table 2.

Furthermore, the polymer coating solutions of Examples 1 and 8 were each diluted with an organic solvent having the same composition so as to be 2% and then poured on an acrylic plate having a thickness of 1 mm to effect flow-coating. After drying at 60° C. for 10 minutes, homogeneous films each having a film thickness shown in Table 2 were obtained.

Example 10

[Formation, Peeling, and Removal of Fluorine-Containing Polymer]

A 4-inch silicon wafer was spin-coated with the resist solution (P-8) obtained in Synthetic Example 7 at 1500 rpm and the whole was baked at 110° C. to obtain a resist film having a film thickness of 220 nm. Then, using the 5% solution of Example 1, the resist film was spin-coated and the whole was baked at 110° C. to obtain a two-layer film.

The two-layer film was covered with pure water in a thickness of 1 mm. The film was exposed with UV light using a high-pressure mercury lamp through a photomask from an upper part of the water surface thereof and then the pure water was removed, followed by thermal treatment at 130° C.

Thereafter, the film was immersed in the fluorinated acetal (A) of Synthetic Example 1. As a result, the whole fluorine-containing coating film of Example 1 was promptly dissolved to leave a resist film having a film thickness of 219 nm. The film remaining ratio was as follows: 219×100÷220=99.5%. The results are shown in Table 2.

Then, development was performed at 23° C. for 1 minute using a 2.38% by weight aqueous tetramethylammonium hydroxide solution. As a result, the exposed part of the resist film was dissolved to leave a pattern similar to the photomask.

Example 11

[Formation, Peeling, and Removal of Fluorine-Containing Polymer]

Similarly to Example 10, the resist film was spin-coated with the 5% solution of each of Examples 2 to 9 and the whole was baked at 110° C. to obtain a two-layer film.

The two-layer film was covered with pure water in a thickness of 1 mm. The film was exposed with UV light using a high-pressure mercury lamp through a photomask from an upper part of the water surface thereof and then the pure water was removed, followed by thermal treatment at 130° C.

Thereafter, two-layer films coated with the fluorine-containing polymer coatings of Examples 2 to 5 were immersed in the fluorinated acetal (A) of Synthetic Example 1 and two-layer films coated with the fluorine-containing coatings of Examples 6 to 9 were immersed in the fluorinated acetal (B) of Synthetic Example 2. In all cases, the fluorine-containing coatings were promptly dissolved. The film remaining ratio of the resist film in each case is shown in Table 2.

Then, development was performed at 23° C. for 1 minute using a 2.38% by weight aqueous tetramethylammonium hydroxide solution. As a result, the exposed part of the resist film was dissolved to leave a pattern similar to the photomask.

TABLE 2

| Example | Fluorine-containing polymer | Fluorinated acetal | Mixed solvent | Solubility | Thickness of fluorine-containing polymer film nm | Film remaining ratio of resist film % |
|---|---|---|---|---|---|---|
| 1 | P-1 | A | MIBK | good | 121 | 99.5 |
| 2 | P-2 | A | 2-octanol | good | 89 | 99.7 |
| 3 | P-3 | A | none | good | 77 | 99.9 |
| 4 | P-4 | B | none | good | 73 | 99.9 |
| 5 | P-5 | C | none | good | 67 | 99.8 |
| 6 | P-5 | D | none | good | 65 | 100 |
| 7 | P-6 | E | hexanol | good | 56 | 99.9 |
| 8 | P-7 | B | MIBK | good | 116 | 99.5 |
| 9 | P-3 | A | hexanol | good | 69 | 99.6 |

MIBK: methyl isobutyl ketone

Example 12

[Formation, Peeling, and Removal of Fluorine-Containing Polymer]

A resist film of (P-8) obtained in a similar manner to Example 10 was spin-coated with the 5% solution obtained in each of Examples 2 to 9 and the whole was baked at 110° C. to obtain a two-layer film.

The two-layer film was covered with pure water in a thickness of 1 mm. The film was exposed with UV light using a high-pressure mercury lamp through a photomask from an upper part of the water surface thereof and then the pure water was removed, followed by thermal treatment at 130° C.

Thereafter, development was performed at 23° C. for 1 minute using a 2.38% by weight aqueous tetramethylammonium hydroxide solution. As a result, the whole surface of the fluorine-containing polymer film was dissolved and simultaneously the exposed part of the resist film was dissolved to leave only non-exposed part of the underlying layer in a rectangular pattern form. Namely, it was possible to remove the fluorine-containing polymer film of the upper layer and the exposed part of the resist film by a single development process.

Example 13

The refractive indices of the fluorine-containing polymer films of Examples 1 and 8 formed on an acrylic plate having a refractive index of 1.49 were measured on a spectroellipsometer to be 1.38 and 1.36 at a wavelength of 650 nm, respectively. Thus, the reflectivity of the surface was suppressed and an antireflection effect could be confirmed.

Comparative Examples 1 to 7

The fluorine-containing polymers P-1 to P-9 obtained in Synthetic Examples 6 and 7 were subjected to dissolution tests using methyl isobutyl ketone (MIBK) of a polar solvent, non-polar heptane, and weakly polar hexanol without any fluorinated acetal of the invention. The dissolution state of the results are shown as ○ (dissolved), Δ (presence of precipitates), and X (non-dissolved). The results are shown in Table 3. A resist film of (P-8) obtained in a similar manner to Example 10 was spin-coated with the 5% solution of the fluorine-containing polymer coating composition in the dissolved case and the whole was baked at 110° C. As a result, a two-layer film was obtained but the case that the interface was mixed was shown as Δ, and the case that the resist film was dissolved and any two-layer film was not obtained was shown as X.

TABLE 3

| Comparative Example | Fluorine-containing polymer | MIBK Solubility | MIBK Film-forming ability | Decane Solubility | Decane Film-forming ability | Hexanol Solubility | Hexanol Film-forming ability |
|---|---|---|---|---|---|---|---|
| 1 | P-1 | Δ | impossible to test | X | impossible to test | X | impossible to test |
| 2 | P-2 | ○ | X | X | impossible to test | ○ | Δ |
| 3 | P-3 | ○ | X | Δ | impossible to test | ○ | Δ |
| 4 | P-4 | ○ | X | Δ | impossible to test | ○ | Δ |
| 5 | P-5 | ○ | X | X | impossible to test | ○ | Δ |
| 6 | P-6 | ○ | X | Δ | impossible to test | ○ | Δ |
| 7 | P-7 | Δ | impossible to test | X | impossible to test | X | impossible to test |

Comparative Example 8

The fluorine-containing polymers P-1 to P-9 obtained in Synthetic Examples 6 and 7 were subjected to dissolution tests in ethyl nonafluorobutyl ether as another fluorinated solvent. After mixing, the mixture was stirred at 60° C. for 2 hours but a sufficient dissolution was not observed in both cases.

Comparative Example 9

A fluorine-containing polymer film obtained by coating with a fluorinated acetal obtained in each of Examples 1 to 9 was subjected to a development test using MIBK or hexanol. However, the resist film was dissolved in the case of MIBK and a sufficient peeling rate was not observed in the case of hexanol, so that the cases showed practical problems.

While the invention has been described in detail and with reference to specific embodiments thereof, it will be apparent to one skilled in the art that various changes and modifications can be made therein without departing from the scope thereof.

This application is based on Japanese patent applications No. 2005-321599 filed on Nov. 4, 2005, the entire contents thereof being hereby incorporated by reference.

What is claimed is:

1. A polymer coating composition obtained by dissolving a fluorine-containing polymer compound in a solvent comprising a fluorinated acetal represented by formula (3):

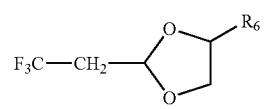

wherein $R_6$ represents a hydrogen atom, a methyl group, or an ethyl group; and the fluorine-containing polymer compound comprising at least one repeated unit selected from the group consisting of:

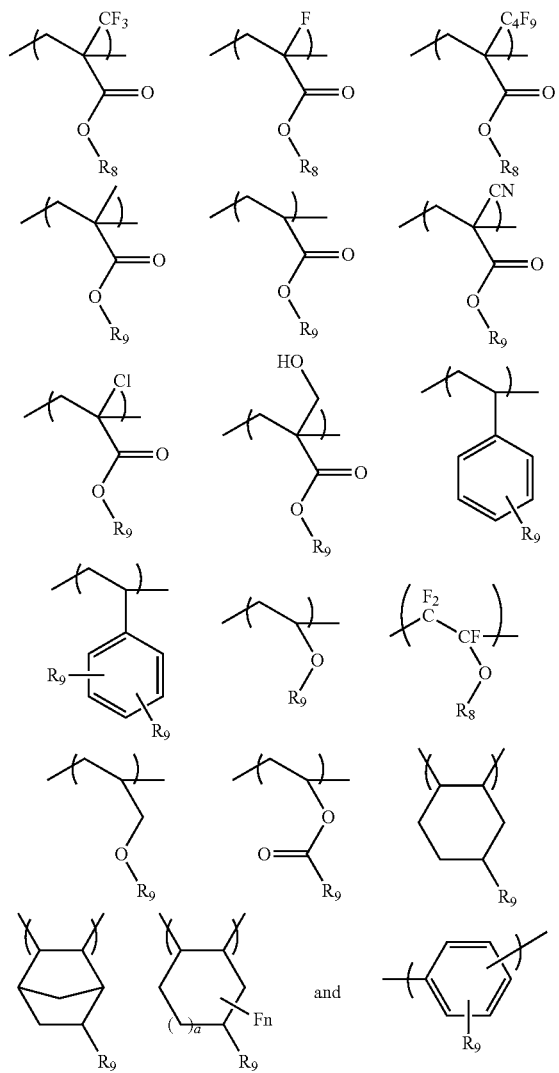

wherein, $R_8$ represents an alkyl group, an alicyclic group, or an aromatic group optionally containing a fluorine atom, $R_9$ represents an alkyl group, an alicyclic group, or an aromatic group containing a fluorine atom, and in each of $R_8$ and $R_9$, said alkyl, alicyclic or aromatic group comprises a functional group represented by formula (2):

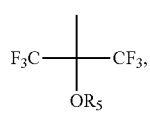

(2)

wherein $R_5$ is a hydrogen atom, a hydrocarbon group, or a protective group having a cyclic structure of 3 to 15 carbon atoms and optionally one or more fluorine atoms.

2. A method for forming a fluorine-containing polymer film comprising:

(i) applying the polymer coating composition according to claim 1 on an organic film, and (ii) evaporating the solvent from the polymer coating composition applied on the organic film to form the fluorine-containing polymer film.

3. The method for forming a fluorine-containing polymer film according to claim 2, wherein the organic film is a photoresist.

4. A method for peeling and removing the fluorine-containing polymer film obtained through the method according to claim 2, comprising (iii) bringing the film into contact with a solvent comprising a fluorinated acetal represented by formula 3, and (iv) peeling and removing the film.

5. A polymer coating composition obtained by dissolving a fluorine-containing polymer compound in a solvent comprising a fluorinated acetal represented by formula (4):

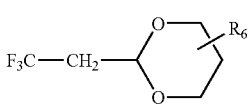

(4)

wherein $R_6$ represents a hydrogen atom, a methyl group, or an ethyl group; and the fluorine-containing polymer compound comprising at least one repeated unit selected from the group consisting of:

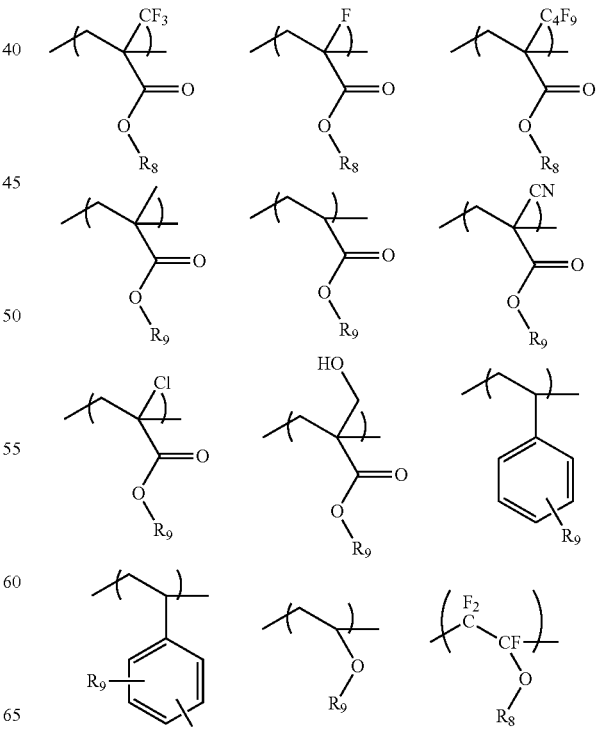

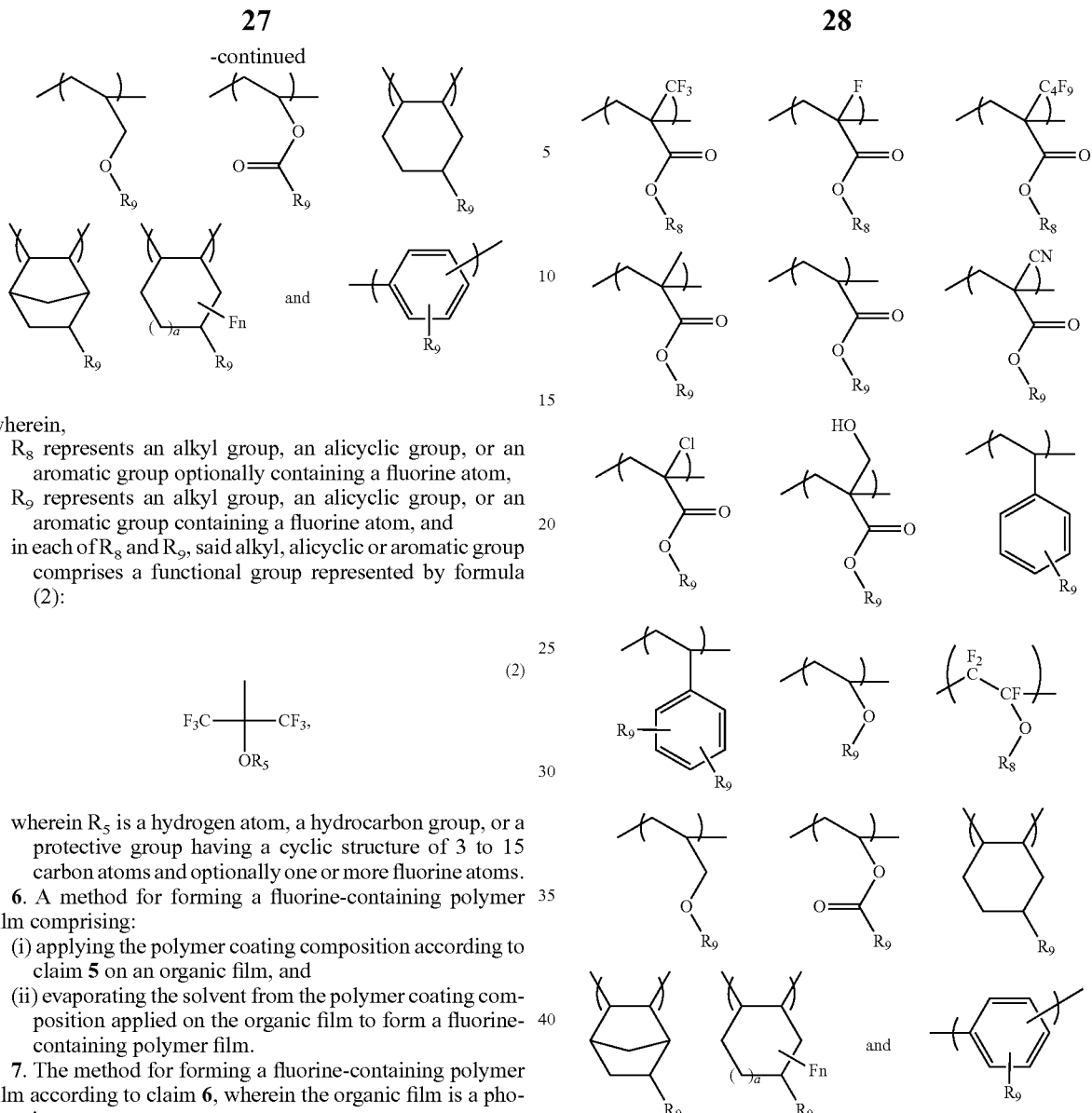

wherein,
R₈ represents an alkyl group, an alicyclic group, or an aromatic group optionally containing a fluorine atom,
R₉ represents an alkyl group, an alicyclic group, or an aromatic group containing a fluorine atom, and
in each of R₈ and R₉, said alkyl, alicyclic or aromatic group comprises a functional group represented by formula (2):

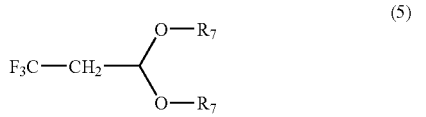

wherein $R_5$ is a hydrogen atom, a hydrocarbon group, or a protective group having a cyclic structure of 3 to 15 carbon atoms and optionally one or more fluorine atoms.

6. A method for forming a fluorine-containing polymer film comprising:
   (i) applying the polymer coating composition according to claim 5 on an organic film, and
   (ii) evaporating the solvent from the polymer coating composition applied on the organic film to form a fluorine-containing polymer film.

7. The method for forming a fluorine-containing polymer film according to claim 6, wherein the organic film is a photoresist.

8. A method for peeling and removing the fluorine-containing polymer film obtained through the method according to claim 6, comprising
   (iii) bringing the film into contact with a solvent comprising a fluorinated acetal represented by formula 4, and
   (iv) peeling and removing the film.

9. A polymer coating composition obtained by dissolving a fluorine-containing polymer compound in a solvent comprising a fluorinated acetal represented by formula (5):

$$F_3C-CH_2-C{\overset{O-R_7}{\underset{O-R_7}{}}} \quad (5)$$

wherein R7 represents an alkyl group which optionally may have a branch having 1 to 5 carbon atoms and may have a fluorine atom; and
the fluorine-containing polymer compound comprising at least one repeated unit selected from the group consisting of:

wherein,
R₈ represents an alkyl group, an alicyclic group, or an aromatic group which may contain a fluorine atom,
R₉ represents an alkyl group, an alicyclic group, or an aromatic group containing a fluorine atom, and
in each of R₈ and R₉, said alkyl, alicyclic or aromatic group comprises a functional group represented by formula (2):

$$F_3C-\underset{OR_5}{\overset{|}{C}}-CF_3 \quad (2)$$

wherein $R_5$ is a hydrogen atom, a hydrocarbon group, or a protective group having a cyclic structure of 3 to 15 carbon atoms and optionally one or more fluorine atoms.

10. A method for forming a fluorine-containing polymer film comprising:
(i) applying the polymer coating composition according to claim 9 on an organic film, and
(ii) evaporating the solvent from the polymer coating composition applied on the organic film to form a fluorine-containing polymer film.

11. The method for forming a fluorine-containing polymer film for photoresist protection or reflection prevention according to claim 10, wherein the organic film is a photoresist.

12. A method for peeling and removing the fluorine-containing polymer film obtained through the method according to claim 10, comprising
(iii) bringing the film into contact with a solvent comprising a fluorinated acetal represented by formula 5, and
(iv) peeling and removing the film.

* * * * *